(12) United States Patent
Strzalkowski

(10) Patent No.: US 10,948,359 B2
(45) Date of Patent: Mar. 16, 2021

(54) TECHNIQUES FOR JUNCTION TEMPERATURE DETERMINATION OF POWER SWITCHES

(71) Applicant: Analog Devices International Unlimited Company, Limerick (IE)

(72) Inventor: Bernhard Strzalkowski, Munich (DE)

(73) Assignee: Analog Devices International Unlimited Company, Limerick (IE)

( * ) Notice: Subject to any disclaimer, the term of this patent is extended or adjusted under 35 U.S.C. 154(b) by 312 days.

(21) Appl. No.: 16/175,275

(22) Filed: Oct. 30, 2018

(65) Prior Publication Data
US 2020/0132557 A1 Apr. 30, 2020

(51) Int. Cl.
| | | |
|---|---|---|
| *G01K 7/00* | (2006.01) |
| *G01K 13/00* | (2021.01) |
| *G01K 7/16* | (2006.01) |
| *H03K 17/081* | (2006.01) |
| *G01K 1/20* | (2006.01) |
| *H03K 17/08* | (2006.01) |

(52) U.S. Cl.
CPC ............... *G01K 7/16* (2013.01); *G01K 1/20* (2013.01); *H03K 17/08104* (2013.01); *H03K 17/08116* (2013.01); *H03K 2017/0806* (2013.01)

(58) Field of Classification Search
USPC .................... 374/1, 170, 178, 173, 141, 152
See application file for complete search history.

(56) References Cited

U.S. PATENT DOCUMENTS

| | | |
|---|---|---|
| 6,046,470 A | 4/2000 | Williams et al. |
| 6,288,597 B1 | 9/2001 | Hasegawa et al. |
| 7,176,508 B2 | 2/2007 | Joshi et al. |
| 7,988,354 B2 | 8/2011 | Jansen |
| 8,155,916 B2 | 4/2012 | Baginski et al. |
| 8,478,559 B2 | 7/2013 | Baginski et al. |
| 8,602,645 B2 * | 12/2013 | Miyamoto ............... G01K 7/42 374/178 |

(Continued)

FOREIGN PATENT DOCUMENTS

| | | |
|---|---|---|
| CN | 104848961 | 8/2015 |
| CN | 107565802 A | 1/2018 |

(Continued)

OTHER PUBLICATIONS

Baker, Nicholas Raymond, "An Electrical Method for Junction Temperature Measurement of Power Semiconductor Switches", (2016), 90 pages.

(Continued)

*Primary Examiner* — Mirellys Jagan
(74) *Attorney, Agent, or Firm* — Schwegman Lundberg & Woessner, P.A.

(57) ABSTRACT

Techniques for determining a temperature measurement of a junction of a power switch are described. A current can be applied to a control node, e.g., gate terminal, of the power switch, such as a field-effect transistor (FET) or an insulated-gate bipolar transistor (IGBT), while the power switch is in a steady-state region in which a gate-to-source voltage (e.g., FET) or a gate-to-emitter voltage (e.g., IGBT) of the power switch is constant. While in the steady-state region, the temperature measurements can be performed, thereby ensuring accuracy of the measurement.

20 Claims, 4 Drawing Sheets

(56) References Cited

U.S. PATENT DOCUMENTS

| | | | |
|---|---|---|---|
| 9,010,999 B2 | 4/2015 | Schuler | |
| 9,608,618 B2 | 3/2017 | Sakai et al. | |
| 9,689,754 B2* | 6/2017 | Thogersen | G01K 13/00 |
| 2010/0001785 A1 | 1/2010 | Baginski et al. | |
| 2011/0150028 A1* | 6/2011 | Nguyen Hoang | H05B 45/56 |
| | | | 374/1 |
| 2013/0177041 A1* | 7/2013 | Sundaramoorthy | H01L 22/30 |
| | | | 374/178 |
| 2013/0285712 A1* | 10/2013 | Kanschat | H03K 17/163 |
| | | | 327/109 |
| 2014/0112372 A1 | 4/2014 | Hoene et al. | |
| 2015/0280416 A1* | 10/2015 | Kreuter | H03K 17/0826 |
| | | | 361/55 |
| 2016/0377488 A1* | 12/2016 | Sjoroos | G01R 31/2642 |
| | | | 374/163 |
| 2020/0256912 A1* | 8/2020 | Degrenne | G01R 31/27 |

FOREIGN PATENT DOCUMENTS

| | | |
|---|---|---|
| DE | 102010000875 A1 | 7/2011 |
| DE | 102014204648 A1 | 9/2015 |
| EP | 2541220 B1 | 4/2015 |
| EP | 3208586 A1 | 8/2017 |
| GB | 2549934 A | 11/2017 |
| JP | 2003007934 A | 1/2003 |
| JP | 2003319638 A | 11/2003 |

OTHER PUBLICATIONS

Baker, Nick, et al., "IGBT Junction Temperature Measurement via Peak Gate Current", (Aug. 5, 2015).

Baker, Nick, et al., "Online Junction Temperature Measurement via Internal Gate Resistance During Turn-On", 2014 16th European Conference on Power Electronics and Applications INSPEC Accession No. 14617528, (Aug. 26, 2014), 10 pages.

Bodo's Power Systems, "Stacked Molded Power Modules and Shower Power liquid cooling", www.bodospower.com, (Apr. 2010), 70 pages.

Denk, Marco, et al., "Online Junction Temperature Cycle Recording of an IGBT Power Module in a Hybrid Car", Advances in Power Electronics vol. 2015, Article ID 652389, (Jan. 16, 2015), 15 pages.

Sundaramoorthy, V, et al., "Online Estimation of IGBT Junction Temperature (Tj) using Gate-Emitter Voltage (Vge) at Turn-Off", (Sep. 2, 2013).

Brekel, Waleri, et al., "Time Resolved in Situ Tvj Measurements of 6.5k IGBTs during Inverter Operation", Proceedings PCIM Europe 2009 Conference ISBN: 978-3-8007-3158-9. (2009), 6 pages.

Denk, Marco, et al., "An IGBT Driver Concept with Integrated Real-Time Junction Temperature Measurement", PCIM Europe, (May 2014), 8 pages.

Denk, Marco, et al., "Junction Temperature Measurement during Inverter Operation using a TJ-IGBT Driver", PCIM Europe 2015, (May 2015), 8 pages.

\* cited by examiner

TECHNIQUES FOR JUNCTION TEMPERATURE DETERMINATION OF POWER SWITCHES

FIELD OF THE DISCLOSURE

This document pertains generally, but not by way of limitation, to power switches, and more particularly, to temperature measurement techniques.

BACKGROUND

In high density power converter or inverter applications, it can be important to know the instantaneous chip or junction temperature. The instantaneous chip or junction temperature can be used for temperature monitoring and fast over-temperature protection. For new power switch technology, e.g., field-controlled power switches, such as silicon carbide (SiC) or gallium nitride (GaN), external temperature sensors may not be appropriate due to size, costs, tolerances, or junction temperature (Tj) measurement propagation delay.

SUMMARY OF THE DISCLOSURE

This disclosure describes, among other things, techniques for determining a temperature measurement of a junction of a power switch. Unlike other approaches that can output a signal when the junction temperature meets or exceeds a threshold level, e.g., an over-temperature signal, this disclosure is directed to techniques for determining and outputting a continuous temperature measurement, for example, of a junction of a power switch, e.g., field-controlled power switch. A current can be applied to a control node, e.g., gate terminal, of the power switch, such as a field-effect transistor (FET) or an insulated-gate bipolar transistor (IGBT), while the power switch is in a steady-state region in which a gate-to-source voltage (e.g., FET) or a gate-to-emitter voltage (e.g., IGBT) of the power switch is constant. While in the steady-state region, the temperature measurements can be performed, thereby ensuring accuracy of the measurement.

In some aspects, this disclosure is directed to a method of providing a junction temperature measurement of a power switch having a control node and an internal control node resistance. The method comprises controlling an application of first and second currents to the internal control node resistance when the power switch is operating within a steady-state region in which a gate-to-source voltage or a gate-to-emitter voltage of the power switch is constant; determining a difference between first and second voltage drops across the internal control node resistance of the power switch caused by the corresponding first and second currents applied; and outputting a signal representing the measurement of the junction temperature of the power switch based on the determined difference.

In some aspects, this disclosure is directed to a circuit configured to provide a junction temperature measurement of a power switch having a control node and an internal control node resistance. The circuit comprises a current source configured to apply first and second currents to the internal control node resistance when the power switch is operating within a steady-state region in which a gate-to-source voltage or a gate-to-emitter voltage of the power switch is constant; and a calibration and calculation circuit configured to: determine a difference between first and second voltage drops across the internal control node resistance of the power switch caused by the corresponding first and second currents applied; and output a signal representing the measurement of the junction temperature of the power switch based on the determined difference.

In some aspects, this disclosure is directed to a circuit configured to provide a junction temperature measurement of a power switch having a control node and an internal control node resistance. The circuit comprises means for controlling an application of first and second currents to the internal control node resistance when the power switch is operating within a steady-state region in which a gate-to-source voltage or a gate-to-emitter voltage of the power switch is constant; means for determining a difference between first and second voltage drops across the internal control node resistance of the power switch caused by the corresponding first and second currents applied; and means for outputting a signal representing the measurement of the junction temperature of the power switch based on the determined difference.

This overview is intended to provide an overview of subject matter of the present patent application. It is not intended to provide an exclusive or exhaustive explanation of the inventive subject matter. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Instantaneous chip or junction temperatures can be needed for temperature monitoring and fast over-temperature protection. For new power switch technology, e.g., field-controlled power switches, such as silicon carbide (SiC) or gallium nitride (GaN), external temperature sensors may not be appropriate due to size, costs, tolerances, or junction temperature (Tj) measurement propagation delay.

One approach for fast temperature measurement can use temperature sensor integration in the chip structure. Another approach can use the internal gate resistor ($R_{Gint}$) of the control node, e.g., gate terminal, to determine a chip temperature. For field-controlled power switches, such as silicon or silicon carbide field-effect transistors, the gate node can be made using a poly-silicon deposition on a gate oxide. Polysilicon has an almost constant temperature coefficient $\alpha=9.4\times10^{-4}$ 1/K and can offer good linearity over a wide temperature range. The measurement of an internal control node resistance, such as an internal gate resistance $R_{Gint}$, can be used to determine the junction temperature Tj using Equation 1:

$$R_{GINT}(T_j) = R_{GINT}(T_a) \times (1 + \alpha(T_j - T_a))$$  Equation 1 where $R_{GINT}$ is the internal gate resistance, Tj is the junction temperature, Ta is the ambient temperature, and α is the temperature coefficient.

Unlike other approaches that can output a signal when the junction temperature meets or exceeds a threshold level, e.g., an over-temperature signal, this disclosure is directed to techniques for providing a temperature measurement, e.g., a continuous temperature measurement, of a junction of a power switch, e.g., field-controlled power switch. Using various techniques of this disclosure, a current can be applied to a control node, e.g., gate terminal, of the power switch, such as a field-effect transistor (FET) or an insulated-gate bipolar transistor (IGBT), while the power switch is in a steady-state region in which a gate-to-source voltage (e.g., FET) or gate-to-emitter voltage (e.g., IGBT) of the power switch is constant. During the time period when the transistor is in the steady-state region, the internal gate-source voltage or gate-emitter voltage can change only slightly, e.g., several millivolts, and thus does not impact the steady state of the power switch. While in the steady-state region, the temperature measurements can be performed, thereby ensuring accuracy of the measurement. Additionally, using various techniques of this disclosure, the voltage drop across the internal control node resistance, e.g., internal gate resistance, of the power switch can be measured directly, thereby simplifying the measurement circuitry used to calculate the junction temperature.

Figure 1:
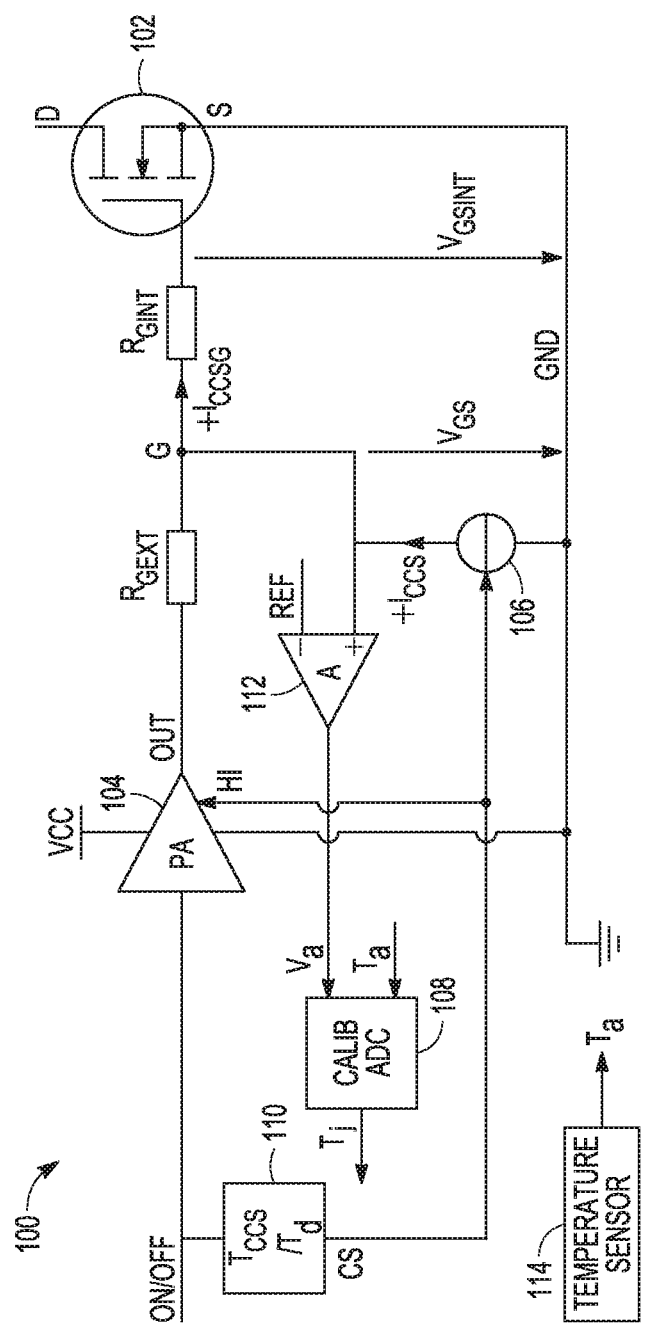
FIG. 1 is a schematic diagram of an example of a junction temperature measurement circuit that can implement various techniques of this disclosure.

FIG. 1 is a schematic diagram of an example of a junction temperature measurement circuit that can implement various techniques of this disclosure. The circuit 100 can include a power switch 102 that can be driven by a power amplifier (PA) circuit 104. The power switch 102 can be a field-controlled switch, such as a field-effect transistor (FET) or an insulated-gate bipolar transistor (IGBT). For purposes of conciseness, the power switch 102 (or "power transistor") is described in this disclosure as a FET, but it is not limited to such implementations. In the example configuration depicted in FIG. 1, the power switch 102 can include a control node, e.g., gate terminal G, and an internal gate resistance $R_{GINT}$.

The circuit 100 can include a current source 106, e.g., constant current source, to source a current $I_{CCS}$, which can be applied to the internal gate resistance $R_{GINT}$ of the power switch 102. In this disclosure, the current source 106 can apply either positive or negative current. As such, the current source 106 can include a current sink. In addition, the circuit 100 can include a junction temperature (Tj) calibration and calculation circuit 108, a timing circuit 110, and an amplifier circuit 112. The calibration and calculation circuit 108 can include analog-to-digital converter (ADC) circuit configured to generate a digital value of the signal representing the measurement of the junction temperature.

Using the techniques of this disclosure, the junction temperature Tj of the power switch 102 can be determined while the power switch 102 is operating in a steady-state region. After the turn-on or turn-off time have elapsed, the power switch 102 can remain in steady state and the gate current can approach almost zero. In the steady-state region, the timing circuit 110 can control the current source 106 to apply a current, e.g., a positive current in FIG. 1 and a negative current in FIG. 3, to the gate terminal G of the power switch 102 for a short time period, e.g., time period $T_{CCS}$=(t2−t1) in FIGS. 2 and 4 and/or time period $T_{CCS}$=(t4−t3) in FIGS. 2 and 4. During this time period, the internal gate-source voltage $V_{GSINT}$ changes only slightly, e.g., in the range of several millivolts, and may not impact the steady state operation of the power switch 102.

In some example implementations, it can be desirable to calibrate the circuit 100. For example, the internal gate resistance $R_{GINT}$ of a power switch can vary in range by 10% or more because of manufacturing tolerances. In some example implementations, a calibration can be performed during an initial system power-on when the junction temperature Tj of the power switch 102 is equal to the ambient temperature Ta. The calibration and calculation circuit 108 can receive a temperature signal Ta from a temperature sensor 114, e.g., a sensor internal to the calibration and calculation circuit 108 or external to the calibration and calculation circuit 108.

The timing circuit 110 can output a control signal CS to the current source 106 to control the timing of the application of the current to the gate terminal G such that the current $I_{CCS}$ is applied when the power switch 102 is in its steady-state operating region. A switch-on time $T_{CCS}$ of the current source 106 and a time delay Td related to the power switch ON/OFF control signal can be adjusted for different types of power switches, e.g., field-controlled transistor such as FETs and IGBTs. In some example implementations, the control signal CS can be synchronized to the power switch ON/OFF control signal in the timing circuit 110.

The application of the current to the gate terminal G of the power switch 102 can cause an additional voltage drop across the internal gate resistance $R_{GINT}$ of the power switch 102, which can be applied to the amplifier circuit 112. The amplifier circuit 112 can output an amplified signal to the calibration and calculation circuit 108.

The calibration and calculation circuit 108 can receive the output of the amplifier circuit 112, which can represent a voltage drop across the internal gate resistance caused by the applied current, e.g., at an ambient temperature Ta. The calibration and calculation circuit 108 can determine a voltage drop based on the received output. The voltage drop across the internal gate resistance $R_{GINT}$ can be proportional to the constant current value ($I_{CCS}$) and to the junction temperature Tj, where $V_{GINT}(Tj) R_{GINT}(Tj) \times I_{CCSG}$.

At an ambient temperature Ta, the initial voltage drop across the internal gate resistance $R_{GINT}$ of the power switch 102 can be equal to $R_{GINT}(Ta) \times I_{CCS}$ (shown as voltage V1 in FIG. 2) and can be the initial value for system calibration. As the junction temperature Tj increases while the power switch 102 operates, the voltage drop across the internal gate resistance $R_{GINT}(Tj)$ can increase (shown as voltage V2 in FIG. 2).

The calibration and calculation circuit 108 can use the difference between the two voltages, e.g., $[R_{GINT}(Tj) - R_{GINT}(Ta)] \times I_{CCSG}$, for junction temperature Tj determination. For example, during power-up of the power amplifier circuit 104 or the whole inverter/converter system, the junction temperature Tj can equal the ambient temperature Ta because the power switch 102 was turned off. In this initialization time period, the calibration and calculation circuit 108 can receive the ambient temperature Ta from the external sensor 114 and can calculate the junction temperature Tj by applying the current $I_{CCS}$ to the gate node G. Because the junction temperature Tj equals the ambient temperature Ta, the calibration and calculation circuit 108 can set the ambient temperature Ta as the initial junction temperature Tj value in Equation 1 (above). In this way, any scattering of the internal gate resistance $R_{GINT}$ during power switch assembly can be erased.

In some example implementations, calibration and calculation circuit 108 can calculate the junction temperature Tj every switching period of the power switch 102. During the measurement periods, e.g., (t2–t1) or (t4–t3) in FIG. 2, the additional voltage increase or voltage drop $R_{GINT}(Tj) \times I_{CCSG}$ can be measured by the amplifier circuit 112.

The calibration and calculation circuit 108 can determine a difference between the two voltage drops, use Equation 1 above to determine a junction temperature Tj, and can output a signal Tj representing the measurement of the junction temperature of the transistor. In some example implementations, the calibration and calculation circuit 108 can include an analog-to-digital converter (ADC) circuit.

In some example implementations, it can be desirable to decouple the voltage drop $R_{GINT}(Tj) \times I_{CCSG}$ measurement circuit from the power control circuit, e.g., power amplifier circuit 104, during the measurement time periods, e.g., time periods t2–t1 and t4–t3. The control signal CS that is output by the timing circuit 110 can control the power amplifier circuit 104 to enter its tri-state mode of operation such that the power amplifier circuit 104 has a high input impedance. By tri-stating the power amplifier circuit 104, its high impedance prevents the applied constant current from flowing into power amplifier circuit 104. This can significantly increase the accuracy of the measurement because all of the current applied by the current source 106 is flowing into the internal gate resistance $R_{GINT}$.

In some example configurations, a power amplifier circuit 104, without a tri-state mode of operation, can be used. In such an example configuration, a small portion of the current $I_{CCS}$ from the current source 106 can flow into the external gate resistance $R_{GEXT}$. This means that the current $I_{CCSG}$ flowing through the internal gate resistance $R_{GINT}$ can be less than the current $I_{CCS}$ from the current source 106, and, as such, additional calibration may need to be performed to cancel the influence of $R_{GEXT}$.

Figure 2:
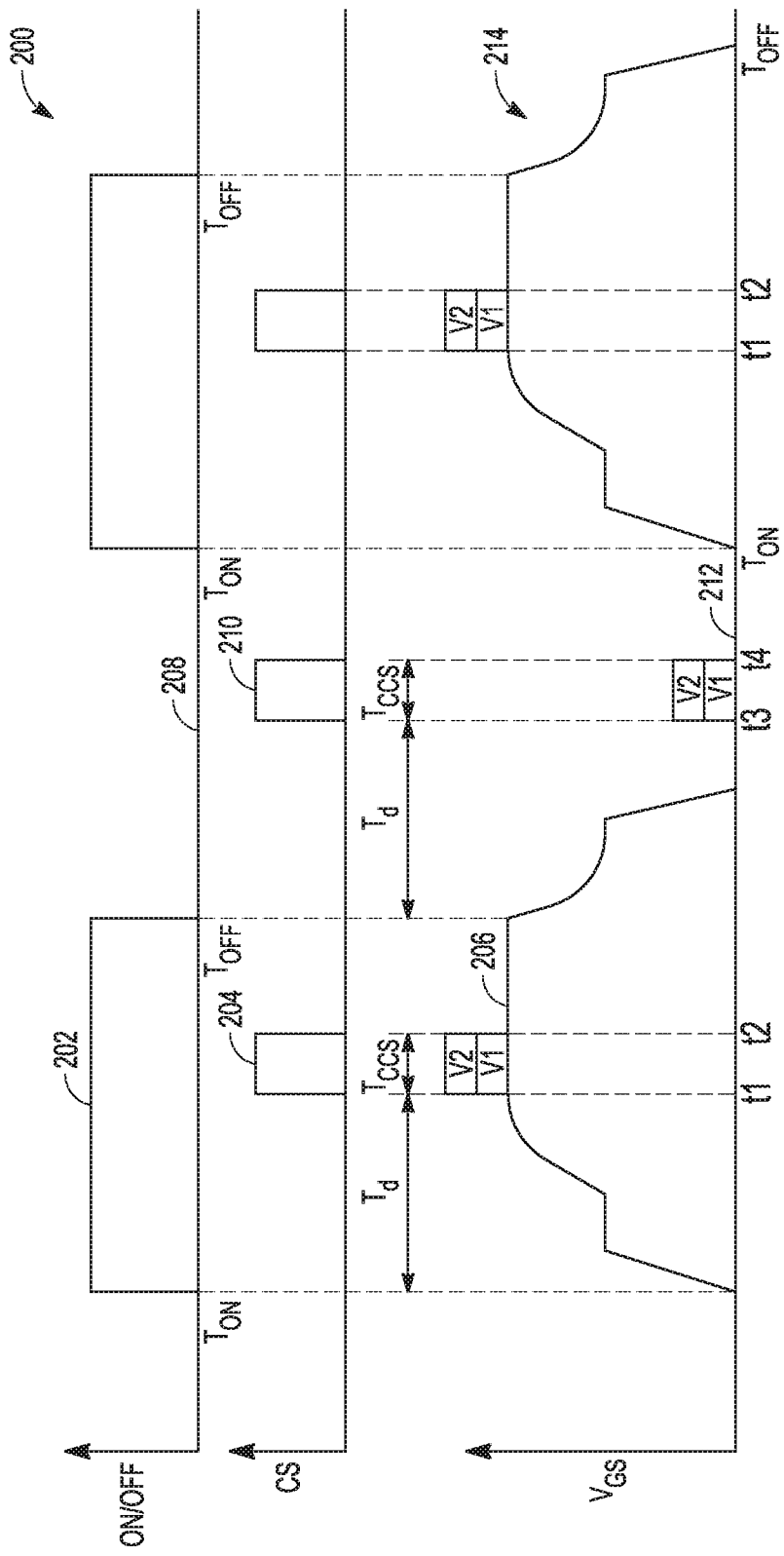
FIG. 2 is an example of a timing diagram associated with operation of the circuit of FIG. 1.

FIG. 2 is an example of a timing diagram 200 associated with operation of the circuit of FIG. 1. The x-axis in FIG. 2 represents time and the three y-axes represent the gate-source voltage $V_{GS}$ of the power switch 102 of FIG. 1, the control signal CS from the timing circuit 110 of FIG. 1, and the ON/OFF control signal of the power switch 102 of FIG. 1.

Starting from the left-hand side of FIG. 2, the gate-source voltage $V_{GS}$ of the power switch 102 of FIG. 1 begins to increase at time TON when the power switch receives an ON signal 202 during a first switching period. After a time delay Td, the timing circuit 110 of FIG. 1 can output the control signal CS at 204. The time delay Td can be sufficient to delay the output of the control signal CS until the gate-source voltage $V_{GS}$ of the power switch is in steady state region 206. As mentioned above, the time delay Td can be adjusted to accommodate different timings of different types of power switches, including but not limited to FETs and IGBTs.

The timing circuit 110 of FIG. 1 can control application of the control signal to the current source 106 of FIG. 1 for a time period $T_{CCS}$. Upon receiving the control signal CS, the current source 106 of FIG. 1 can turn ON and apply a current to the gate terminal G of the power switch 102 in FIG. 1 for the time period $T_{CCS}$.

As an example, upon receiving the control signal CS, the current source 106 of FIG. 1 can turn ON and apply a current to the gate terminal G of the power switch 102 in FIG. 1 for the time period $T_{CCS}$. The amplifier circuit 112 of FIG. 1 can receive the voltage at the gate terminal G of the power switch 102 in FIG. 1 and output a signal to the calibration and calculation circuit 108 of FIG. 1. The calibration and calculation circuit 108 can then determine the voltage drop $V1 = R_{GINT}(Ta) \times I_{CCS}$ at initial power-on. The voltage drop V1 can be the initial value for system calibration and can be stored in a memory device for later comparison when the power switch 102 begins operating.

Later, as the junction temperature Tj increases during operation of the power switch, the voltage drop across the internal gate resistance $R_{GINT}$ can increase to the voltage V2, which can be determined in a manner similar to voltage V1. The voltage V2 can be stored in a memory device for later comparison. The calibration and calculation circuit 108 can determine a difference between voltages V1 and V2, and output a signal representing a temperature measurement.

As seen in FIG. 2, voltage measurements can be taken when the power switch 102 of FIG. 1 is OFF. For example, the gate-source voltage $V_{GS}$ of the power switch 102 of FIG. 1 begins to decrease at time $T_{OFF}$ when the power switch 102 receives an OFF signal 208. After a time delay Td, the timing circuit 110 of FIG. 1 can output the control signal CS at 210. The time delay Td can be sufficient to delay the output of the control signal CS until the gate-source voltage $V_{GS}$ of the power switch 102 is in its linear region 212. As mentioned above, the time delay Td can be adjusted to accommodate different timings of different types of power switches, including FETs and IGBTs. The voltages V1 and V2 during measurement period t4–t3 can be determined in a manner similar to the voltages V1 and V2 described above with respect to measurement period t2–t1.

As mentioned above, in some example implementations, the junction temperature Tj can be calculated every switching period of the power switch 102. A second switching period is shown at 214 with measurements of voltages V1 and V2, which can be used to determine a junction temperature, as described above.

Figure 4:
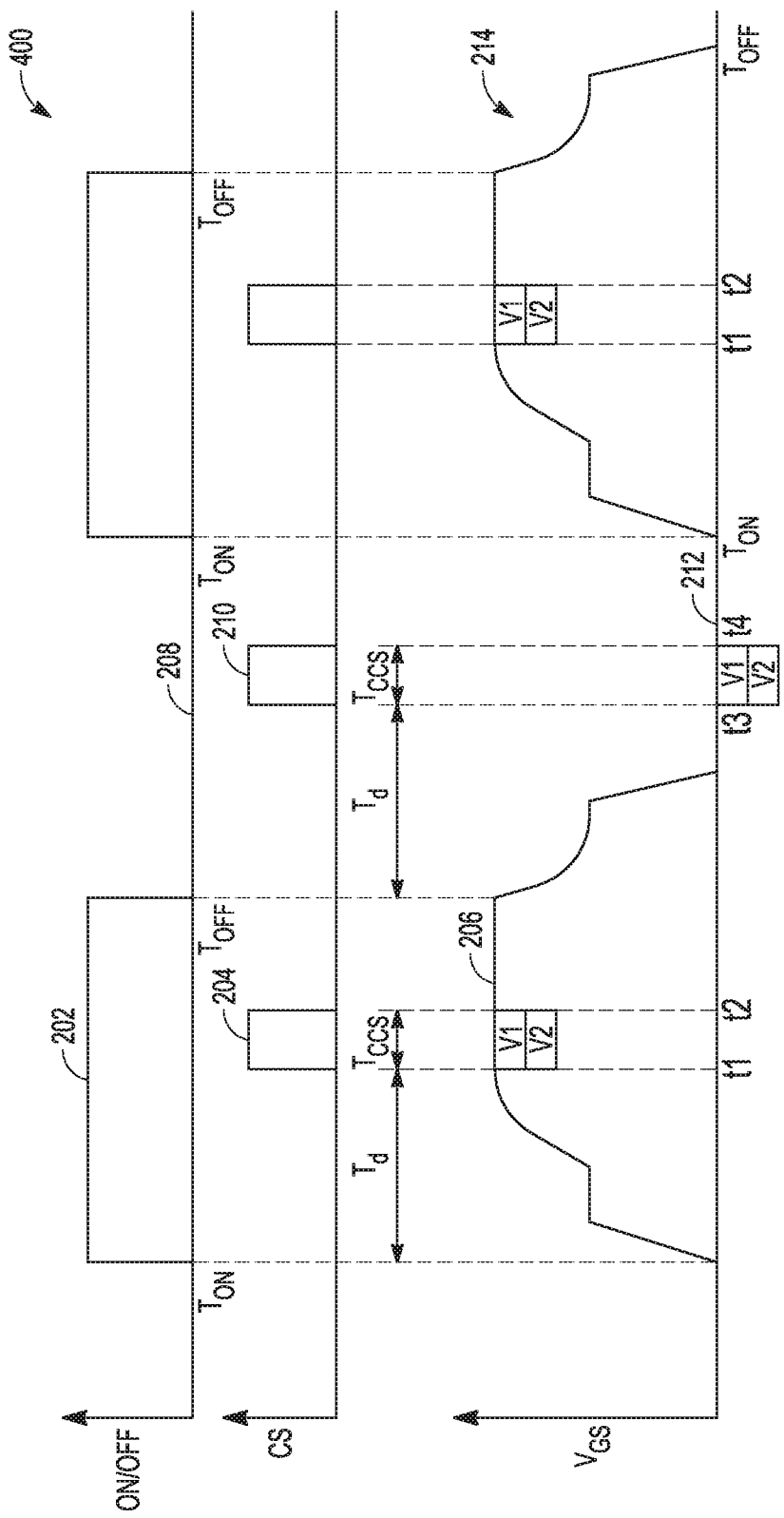
FIG. 4 is an example of a timing diagram associated with operation of the circuit of FIG. 3.

It should be noted that the voltages V1 and V2 in FIG. 2 and in FIG. 4 can refer to any two voltages determined in subsequent time periods such that a difference between the two voltages can be used to determine a junction temperature.

Figure 3:
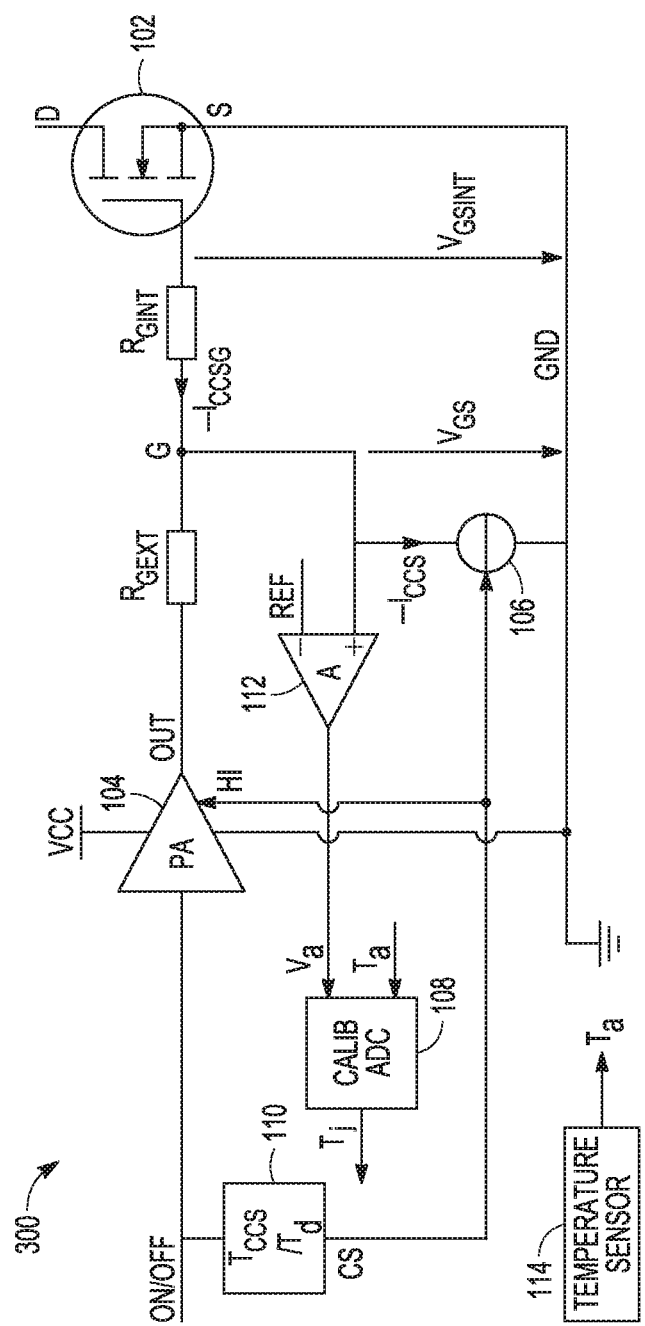
FIG. 3 is a schematic diagram of another example of a junction temperature measurement circuit that can implement various techniques of this disclosure.

In some example configurations, it can be desirable to pull current (or apply negative current) to the gate terminal G of the power switch. For example, if the power switch 102 is in an ON state, the power amplifier circuit 104 is ON and the positive voltage supply $V_{CC}$ is applied to the gate terminal G of the power switch 102. In such a configuration, it can be easier to pull current (or apply negative current) from the gate terminal G because the gate terminal G is at the highest system voltage. In contrast, additional circuitry may be needed to supply a voltage greater than $V_{CC}$ for positive current to be applied to the gate terminal G when the power switch is in an ON state. FIG. 3 depicts an example circuit that applies a negative current to the gate terminal G of the power switch.

Similarly, if the power switch 102 is in an OFF state, the power amplifier circuit 104 is OFF and the lower voltage supply, e.g., ground, is applied to the gate terminal G of the power switch 102. In such a configuration, it can easier to push current (or apply positive current) into the gate terminal G because the gate terminal G is at the lowest system voltage.

FIG. 3 is a schematic diagram of another example of a junction temperature measurement circuit that can implement various techniques of this disclosure. The circuit 300 of FIG. 3 is similar to the circuit 100 of FIG. 1 except that the current source 106 can apply a negative current (in contrast to the positive current applied by the current source 106 of FIG. 1) to pull a current $I_{CCS}$ from the gate terminal G of the power switch 102. The direction of the current $I_{CCS}$ is negative, which can cause a voltage drop of $V_{GSINT}$. In FIG. 1, the direction of the $I_{CCS}$ was positive, causing an additional voltage rise of $V_{GSINT}$. An example of a current sink can include a current mirror referenced to ground. The operation of the circuit 300 in FIG. 3 is otherwise similar to the operation of the circuit 100 in FIG. 1 and, for purposes of conciseness, will not be described in detail.

FIG. 4 is an example of a timing diagram 400 associated with operation of the circuit of FIG. 3. The x-axis in FIG. 4 represents time and the three y-axes represent the gate-source voltage $V_{GS}$ of the power switch 102 of FIG. 3, the control signal CS from the timing circuit 110 of FIG. 3, and the ON/OFF control signal of the power switch 102 of FIG. 3.

In the circuit 300 of FIG. 3, the direction of the current $I_{CCS}$ is negative, which causes a voltage drop of $V_{GSINT}$. The timing diagram 400 of FIG. 4 is similar to the timing diagram 200 of FIG. 2 except that because a current sink is used in the circuit 300 of FIG. 3, the gate-source voltage $V_{GS}$ will decrease as negative current is applied to the gate terminal G of the power switch 102, as shown by the voltage drops V1 and V2.

Using the various techniques above, this disclosure describes a highly accurate and simplified approach to measuring the junction temperature of power switches.

Each of the non-limiting aspects or examples described herein may stand on its own or may be combined in various permutations or combinations with one or more of the other examples.

The above detailed description includes references to the accompanying drawings, which form a part of the detailed description. The drawings show, by way of illustration, specific embodiments in which the inventive subject matter may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein may be machine or computer-implemented at least in part. Some examples may include a computer-readable medium or machine-readable medium encoded with instructions operable to configure an electronic device to perform methods as described in the above examples. An implementation of such methods may include code, such as microcode, assembly language code, a higher-level language code, or the like. Such code may include computer-readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact discs and digital video discs), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments may be combined with each other in various combinations or permutations. The scope of the inventive subject matter should be determined with reference to the appended claims, along with the full scope of equivalents to which such claims are entitled.

The claimed invention is:

1. A method of determining a junction temperature measurement of a power switch having a control node and an internal control node resistance, the method comprising:
    controlling an application of first and second currents to the internal control node resistance when the power switch is operating within a steady-state region in which a gate-to-source voltage or a gate-to-emitter voltage of the power switch is constant;
    determining a difference between first and second voltage drops across the internal control node resistance of the power switch caused by the corresponding first and second currents applied; and
    outputting a signal representing the measurement of the junction temperature of the power switch based on the determined difference.

2. The method of claim 1, further comprising:
    receiving a representation of an ambient temperature of the power switch.

3. The method of claim 1, further comprising:
during the application of the first and second currents, operating an amplifier circuit in a high-impedance state.

4. The method of claim 1, wherein controlling the application of the first and second currents to the internal control node resistance corresponds to a control signal being applied to the control node of the power switch such that the power switch is in an OFF state.

5. The method of claim 4, wherein the first and second currents applied to the internal control node resistance include a positive current.

6. The method of claim 1, wherein controlling the application of the first and second currents to the internal control node resistance corresponds to a control signal being applied to the control node of the power switch such that the power switch is in an ON state.

7. The method of claim 6, wherein the first and second currents applied to the internal control node resistance include a negative current.

8. The method of claim 1, wherein controlling the application of the first and second currents to the internal control node resistance includes delaying the application of the first and second currents until the power switch is operating within the steady-state region.

9. The method of claim 8, wherein delaying the application of the first and second currents until the power switch is operating within the steady-state region includes:
adjusting a time delay based on a type of the power switch.

10. A circuit configured to determine a junction temperature measurement of a power switch having a control node and an internal control node resistance, the circuit comprising:
a current source configured to apply first and second currents to the internal control node resistance when the power switch is operating within a steady-state region in which a gate-to-source voltage or a gate-to-emitter voltage of the power switch is constant; and
a calibration and calculation circuit configured to:
determine a difference between first and second voltage drops across the internal control node resistance of the power switch caused by the corresponding first and second currents applied; and
output a signal representing the measurement of the junction temperature of the power switch based on the determined difference.

11. The circuit of claim 10, further comprising:
a timing circuit configured to:
control the application of the first and second currents to the internal control node resistance; and
delay the application of the first and second currents until the power switch is operating within the steady-state region.

12. The circuit of claim 10, further comprising:
a temperature sensor configured to determine an ambient temperature of the power switch and output a signal to the calibration and calculation circuit.

13. The circuit of claim 10, further comprising:
a power amplifier circuit configured to control operation of the power switch, the power amplifier circuit configured to operate in a high-impedance state during the application of the first and/or second currents.

14. The circuit of claim 10, wherein the current source is configured to apply a negative current.

15. The circuit of claim 10, further comprising:
a timing circuit configured to control the application of the first and second currents to the internal control node resistance to correspond with a control signal being applied to the control node of the power switch such that the power switch is in an OFF state.

16. The circuit of claim 15, wherein the first and second currents applied to the internal control node resistance includes a positive current.

17. The circuit of claim 10, further comprising:
an analog-to-digital converter circuit to generate a digital value of the signal representing the measurement of the junction temperature; and
a timing circuit configured to control the application of the first and second currents to the internal control node resistance to correspond with a control signal being applied to the control node of the power switch such that the power switch is in an ON state.

18. The circuit of claim 17, wherein the first and second currents applied to the internal control node resistance includes a negative current.

19. A circuit configured to provide a junction temperature measurement of a power switch having a control node and an internal control node resistance, the circuit comprising:
means for controlling an application of first and second currents to the internal control node resistance when the power switch is operating within a steady-state region in which a gate-to-source voltage or a gate-to-emitter voltage of the power switch is constant;
means for determining a difference between first and second voltage drops across the internal control node resistance of the power switch caused by the corresponding first and second currents applied; and
means for outputting a signal representing the measurement of the junction temperature of the power switch based on the determined difference.

20. The circuit of claim 19, wherein the first and second currents applied to the internal control node resistance include a negative current.

* * * * *